US008667350B2

(12) United States Patent
Whetsel

(10) Patent No.: US 8,667,350 B2
(45) Date of Patent: Mar. 4, 2014

(54) MULTIPLEXERS SELECTIVELY COUPLING DATA SCAN CELLS IN SCAN PATHS

(71) Applicant: Texas Instruments Incorporated, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/963,625

(22) Filed: Aug. 9, 2013

(65) Prior Publication Data

US 2013/0326298 A1 Dec. 5, 2013

Related U.S. Application Data

(62) Division of application No. 13/757,334, filed on Feb. 1, 2013, now Pat. No. 8,539,291, which is a division of application No. 13/451,989, filed on Apr. 20, 2012, now Pat. No. 8,407,543, which is a division of application No. 13/103,688, filed on May 9, 2011, now Pat. No. 8,185,790, which is a division of application No. 13/012,242, filed on Jan. 24, 2011, now Pat. No. 7,975,196, which is a division of application No. 12/772,640, filed on May 3, 2010, now Pat. No. 7,908,537, which is a division of application No. 12/490,869, filed on Jun. 24, 2009, now Pat. No. 7,739,569, which is a division of application No. 12/139,594, filed on Jun. 16, 2008, now Pat. No. 7,568,142, which is a division of application No. 10/814,671, filed on Mar. 30, 2004, now Pat. No. 7,404,127, which is a division of application No. 09/758,089, filed on Jan. 10, 2001, now Pat. No. 6,728,915.

(60) Provisional application No. 60/175,188, filed on Jan. 10, 2000.

(51) Int. Cl.
*G01R 31/28* (2006.01)

(52) U.S. Cl.
USPC ........................... 714/727; 714/729; 714/734

(58) Field of Classification Search
USPC ................. 714/724, 726, 727, 729, 730, 734
See application file for complete search history.

(56) References Cited

U.S. PATENT DOCUMENTS 5,428,622 A * 6/1995 Kuban et al. .................. 714/729
5,841,791 A * 11/1998 Hashizume ................... 714/726

(Continued)

OTHER PUBLICATIONS

Whetsel, L., "Improved boundary scan design," Test Conference, 1995. Proceedings., International, vol., No., pp. 851,860, Oct. 21-25, 1995.*
Whetsel, L., "Hierarchically accessing 1149.1 applications in a system environment," Test Conference, 1993. Proceedings., International, vol., No., pp. 517,526, Oct. 17-21, 1993.*
Whetsel, L., "Navigating test access in systems," Test Conference, 1994. Proceedings., International, vol., No., pp. 1018,, Oct. 2-6, 1994.*

(Continued)

*Primary Examiner* — Cynthia Britt
(74) *Attorney, Agent, or Firm* — Lawrence J. Bassuk; Wade J. Brady, III; Frederick J. Telecky, Jr.

(57) ABSTRACT

An integrated circuit or circuit board includes functional circuitry and a scan path. The scan path includes a test data input lead, a test data output lead, a multiplexer, and scan cells. A dedicated scan cell has a functional data output separate from a test data output. Shared scan cells each have a combined output for functional data and test data. The shared scan cells are coupled in series. The test data input of the first shared scan cell is connected to the test data output of the dedicated scan cell. The combined output of one shared scan cell is coupled to the test data input lead of another shared scan cell. The multiplexer has an input coupled to the test data output, an input connected to the combined output lead of the last shared scan cell in the series, and an output connected in the scan path.

4 Claims, 7 Drawing Sheets

(56) References Cited

U.S. PATENT DOCUMENTS

| | | | |
|---|---|---|---|
| 6,223,315 B1 * | 4/2001 | Whetsel | 714/727 |
| 6,286,121 B1 * | 9/2001 | Osawa et al. | 714/738 |
| 6,446,230 B1 * | 9/2002 | Chung | 714/726 |
| 6,728,915 B2 * | 4/2004 | Whetsel | 714/727 |

OTHER PUBLICATIONS

Whetsel, L., "An IEEE 1149.1 based test access architecture for ICs with embedded cores," Test Conference, 1997. Proceedings., International, vol., No., pp. 69,78, Nov. 1-6, 1997.*

* cited by examiner

MULTIPLEXERS SELECTIVELY COUPLING DATA SCAN CELLS IN SCAN PATHS

This application is a divisional of prior application Ser. No. 13/757,334, filed Feb. 1, 2013, now U.S. Pat. No. 8,539,291, issued Sep. 17, 2013;

Which was a divisional prior application Ser. No. 13/451,989, filed May 20, 2012, now U.S. Pat. No. 8,407,543, issued Mar. 26, 2013;

Which was a divisional of prior application Ser. No. 13/103,688, filed May 9, 2011, now U.S. Pat. No. 8,185,790, issued May 22, 2012;

Which was a divisional of prior application Ser. No. 13/012,242, filed Jan. 24, 2011, now U.S. Pat. No. 7,675,196, issued Jul. 5, 2011;

Which was a divisional of prior application Ser. No. 12/772,640, filed May 3, 2010, now U.S. Pat. No. 7,908,537, issued Mar. 15, 2011;

Which was a divisional of prior application Ser. No. 12/490,869, filed Jun. 24, 2009, now U.S. Pat. No. 7,739,569, issued Jun. 15, 2010;

Which was a divisional of prior application Ser. No. 12/139,594, filed Jun. 16, 2008, now U.S. Pat. No. 7,568,142, issued Jul. 28, 2009;

Which was a divisional of prior application Ser. No. 10/814,671, filed Mar. 30, 2004, now U.S. Pat. No. 7,404,127, issued Jul. 22, 2008;

Which was a divisional of prior application Ser. No. 09/758,089, filed Jan. 10, 2001, now U.S. Pat. No. 6,728,915, issued Apr. 27, 2004;

Which claims priority from Provisional Application No. 60/175,188, filed Jan. 10, 2000.

BACKGROUND OF THE DISCLOSURE

In FIG. 1, a prior art example of a dedicated boundary scan path or register exists around a master circuit 102, a slave 1 circuit 104, and a slave 2 circuit 106. The master circuit, such as a DSP, CPU, or micro-controller, is a circuit that controls the slaves. The slave circuits are circuits being controlled by the master, such as RAM, ROM, cache, A/D, D/A, serial communication circuits, or I/O circuits. The master and slave circuits could exist as individual intellectual property core sub-circuits inside an integrated circuit or IC, or as individual ICs assembled on a printed circuit board or multi-chip module (MCM). The scan paths 108-112 around each circuit are connected together serially and to a test data input (TDI) 114, which supplies test data to the scan paths, and a test data output (TDO) 116, which retrieves data from the scan paths.

For simplification, only a portion of the scan paths 108-112 of each circuit is shown. The scan paths of FIG. 1 are designed using dedicated scan cells, indicated by capital letters (C) and (D) in circles. The word dedicated means that the cell's circuitry is used for testing purposes and is not shared for functional purposes. The scan cells are located between the internal circuitry and the input buffers 128 and output buffers 130 of the slaves and master circuit.

In FIG. 2, an example of a dedicated scan cell consists of multiplexer 1 (MX1) 202, memory 1 (M1) 204, memory 2 (M2) 206, and multiplexer 1 (MX2) 208. This scan cell is similar to scan cells described in IEEE standard 1149.1, so only a brief description will be provided. During operation in a functional mode, functional data passes from the functional data input (FDI) 212 to the functional data output (FDO) 214. In a functional mode, control inputs 210 to the scan cell can: (1) cause FDI data to be loaded into M1 via MX1 during a capture operation; (2) scan data from TDI 216 through MX1 and M1 to TDO 218 during a shift operation; and (3) cause data in M1 to be loaded into M2 during an update operation. Neither the capture, shift, nor update operation disturbs the functional data passing between FDI and FDO. Thus the scan cell of FIG. 2 can be accessed and pre-loaded with test data while the cell is in functional mode. The data scan cell (D) associated with the D31 output of slave 1 104 has connections corresponding to the FDI 212, TDI 216, FDO 214, and TDO 218 signal connections of the FIG. 2 scan cell.

During a functional mode of operation of the circuit in FIG. 1, data is transferred from one of the slaves to the master via a 32-bit data bus (D0-31), indicated by the wired bus connections 126. In a functional mode the scan cells are transparent, allowing functional control and data signals to pass freely through the cells. In this example, the master enables slave 1 to transfer data by the ENA1 control signal, which is output from the master to slave 1. Likewise the master enables slave 2 to transfer data by the ENA2 control signal, which is output from the master to slave 2. While only two slave circuits are shown, any number could be similarly connected to and operated by the master. Since all the scan cells of the scan paths 108-112 are dedicated for test, they can be scanned from TDI to TDO without disturbing the functional mode of the FIG. 1 circuit As mentioned, being able to scan data into the scan paths during functional mode allows pre-loading an initial test pattern into the scan paths. The initial test pattern establishes both a data test pattern in the data scan cells (D) and a control test pattern in the control scan cells (C). By pre-loading an initial test pattern into the scan paths, the circuits can safely transition from a functioning mode to a test mode without concern over bus contention between the slave circuit's data busses. For example, the ENA1 122 and ENA2 124 control scan cells (C) can be pre-loaded with control data to insure that only one of the slave's D0-31 data busses is enabled to drive the wired bus connection 126. Maintaining output drive on one of the slave data busses upon entry into test mode prevents the wired data bus 126 from entering into a floating. (i.e. 3-state) condition. Preventing bus 126 from floating is desirable since a floating input to input buffers 128 of master 102 could cause a high current condition.

When test mode is entered, functional operation of the master and slave circuits stop and the scan cells in the scan paths take control of the master and slave circuit's data and control signal paths. A data scan cell (D) exists on each of the 32-bit data signal paths of each circuit 102-106, and a control scan cell (C) exists on each of the ENA1 and ENA2 control paths of each circuit 102-106. Having dedicated data and control scan cells located as shown in FIG. 1, enables safe test entry and easy interconnect testing of the wiring between the master and slave circuits when the scan paths are placed in test mode. During interconnect test mode, a capture, shift, and update control sequence, such as that defined in IEEE standard 1149.1, can be used to control the scan paths.

To prevent contention between slave 1 and slave 2 data outputs 126 during the capture, shift, and update control sequence, the 3-state control outputs 118-120 of the ENA1 and ENA2 control scan cells 122-124 do not ripple during the capture and shift part of the control input sequence. This is accomplished by having the data in M2 of FIG. 2 be output, via MX2, during the capture and shift operation. Only during the update part of the control input sequence are the outputs 118-120 of the control scan cells 122-124 allowed to change state by new data being loaded into M2. Similarly, the outputs from the data scan cells (D) do not ripple during capture and shift operations, but rather change state only during the update part of the control input sequence.

In FIG. 3, a prior art example of a shared boundary scan path exists around a master 302 and slave circuits 304-306. As in FIG. 1, the scan paths 308-312 around each circuit are connected together serially and to a test data input (TDI), which supplies test data to the scan paths, and a test data output (TDO), which retrieves data from the scan paths. The scan paths of FIG. 3 are designed using shared scan cells (C) and (D), i.e. the scan cell memory is shared for both test and functional purposes. As an aid to indicate use of shared scan cells as opposed to dedicated scan cells, the shared scan cells of FIG. 3 and subsequent figures are shown positioned outside the boundary scan paths 308-312 and in the functional circuits. The dedicated scan cells of FIG. 1 were shown positioned inside the boundary scan paths 108-112. Again, for simplification, only a portion of each circuit's boundary scan path is shown.

In FIG. 4, an example of a conventional shared scan cell consists of a multiplexer (MX) 402 and a memory (M) 404. During a functional mode of operation, control inputs 406 form a path between FDI 408 and the data input of M 404 via MX 402, to allow functional data to be clocked from FDI to FDO 410. During a test mode, the control inputs 406 cause FDI data to be clocked into M via MX during a capture operation, and cause test data to be clocked from TDI 412 to TDO 414 during a shift operation. Since M 404 is used functionally, it cannot be accessed and pre-loaded with test data as can the scan cell of FIG. 2. Thus the ability to access and pre-load test data while the master and slave circuits of FIG. 3 operate functionally is one of the key distinctions between dedicated (FIG. 2) and shared (FIG. 4) scan cells.

In FIG. 3, the data scan cell associated with the D31 output of slave 1 304 is labeled to indicate the FDI 408, TDI 412, FDO 410, and TDO 414 signal connections of the FIG. 4 scan cell.

During the functional mode of the circuit in FIG. 3, as in FIG. 1, data is transferred from one of the slaves to the master via the 32-bit data bus (D0-31) through shared connections 326. The master enables data transfer from slave 1 or slave 2 via the ENA1 and ENA2 control signals, respectively. Since the scan cells of the scan paths are shared and used functionally, they cannot be scanned from TDI to TDO without disturbing the functional mode of the circuits. Not being able to scan data into the scan paths during functional mode prevents pre-loading an initial test pattern into the scan paths.

By not being able to pre-load an initial test pattern into the scan paths, the slave circuits are put at risk of not safely transitioning into the test mode from the functional mode. This situation occurs due to the timing domains of the functional and test modes not being synchronous to one another, which results in asynchronous functional to test mode switching.

For example, if the circuits of FIG. 3 switched from the functional mode timing domain to a test mode timing domain, a possibility exists that the D0-31 output buffers of slave 1 and 2 could both be enabled as a result of an asynchronous mode switch that caused scan cell ENA1 322 and scan cell ENA2 324 to both output enable conditions on wires 318 and 320. This would force a voltage contention situation between slave 1 and 2, resulting in the output buffers being damaged or destroyed. This voltage contention situation does not occur in the boundary scan path of FIG. 1 since an initial safe test pattern is pre-loaded into the scan cells prior to the functional to test mode switching step.

Once in a test mode, the scan path of FIG. 3 can be accessed to shift in test data. During shift operations the outputs 318-320 of the control scan cells 322-324 ripple as data shifts through the cells. This output ripple from the control scan cells can cause the D0-31 output buffers of the slaves to be enabled and disabled during the shift operation. This control output ripple causes the output buffers of slaves 1 and 2 to be simultaneously enabled, again creating bus contention between the slaves. This voltage contention situation does not occur in the boundary scan oath of FIG. 1 since M 206 maintains a safe control output via MX 208, during shift operations.

In FIG. 5, one prior art technique prevents the above-mentioned two voltage contention situations. The technique is based on providing additional circuitry and control inputs to enable or disable the slave's output buffers during test mode entry and again during each test mode shift operation. A signal gating circuit 528 is inserted into signal path 518 of slave 504 and a signal gating circuit 530 is inserted into signal path 520 of slave 506. A control signal C1 532 is added as an input to circuits 528 and 530. When C1 is in a first state, the ENA1 and ENA2 outputs from scan cells 522 and 524 are allowed to pass through circuits 528 and 530 to enable or disable the output buffers of slaves 504 and 506. However, when C1 is in a second state, the outputs of circuits 528 and 530 are forced, independent of ENA1 and ENA2, to disable the output buffers of slaves 504 and 506. By controlling C1 to the second state during the transition from functional mode to test mode, the first above mentioned voltage contention situation can be avoided. By again controlling C1 to the second state during each shift operation that occurs during test mode, the second above mentioned voltage contention situation can be avoided.

While the technique described above solves the voltage contention situations, it does so by introducing a floating (i.e. 3-state) condition on data bus 526. As described above, the output buffers of slaves 504 and 506 are disabled during test mode entry and during each shift operation. With the output buffers disabled, data bus 526 is not driven and may float to a voltage level that could turn on both input transistors of the input buffers of master 502. This could result in a low impedance path between the master's supply and ground voltages, potentially damaging or destroying the input buffers of master 502.

BRIEF SUMMARY OF THE DISCLOSURE

This disclosure provides a boundary scan system where memories, i.e. flip flops or latches, used in data scan cells are also used functionally, but memories used in control scan cells are dedicated for test and not used functionally. The control scan cells can be scanned while the circuit is in functional mode, since their memories are dedicated. However, the data scan cells can only be scanned after the circuit transitions into test mode, since their memories are shared. This boundary scan system advantageously provides: (1) lower test circuitry overhead since the data scan cells use shared memories; (2) safe entry into test mode since the control scan cells can be scanned during functional mode to pre-load safe control conditions; and (3) avoidance of floating (i.e. 3-state) busses that can cause high current situations.

DETAILED DESCRIPTION OF THE DISCLOSURE

Figure 6:
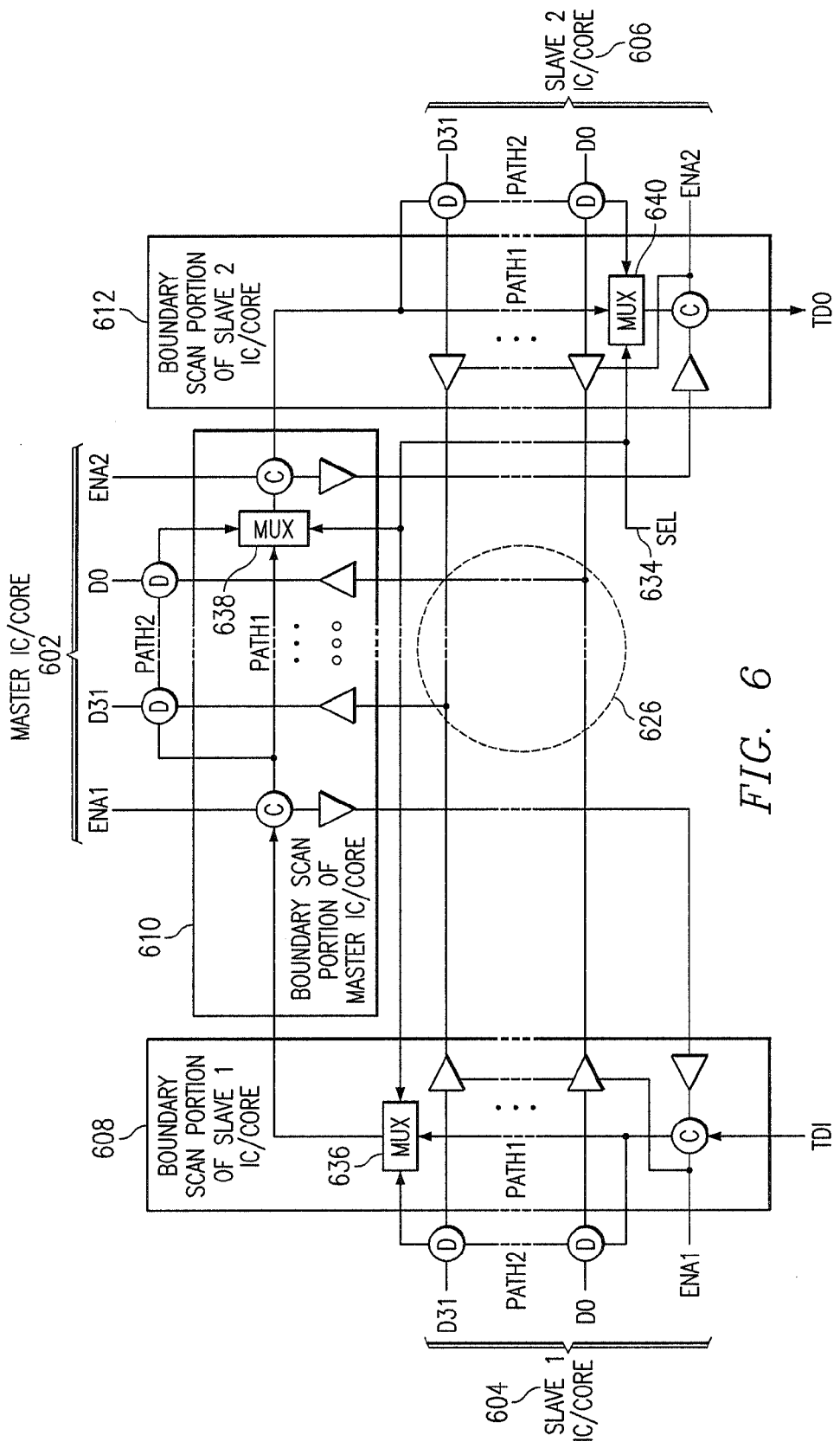
FIG. 6 is a simplified block diagram of a boundary scan path around a master IC/core and two slave IC/cores according to the disclosure.

In FIG. 6, a boundary scan system according to the present disclosure comprises a master circuit 602 operable to receive data transmitted from two slave circuits 604-606. The circuits 602-606 each have a boundary scan path 608-612, a portion of which is shown. The scan paths around each circuit are connected together serially and to TDI, which supplies test data to the scan paths, and TDO, which retrieves data from the scan paths. A first difference between the known scan paths and the scan path of FIG. 6 is that the control scan cells (C) of the scan paths in FIG. 6 are designed as dedicated scan cells, and the data scan cells (D) are designed as shared cells. A second difference is that the scan path has two configurations. In one configuration, the control cells reside on a serial path (path1) separate from the serial path (path2) on which the data scan cells reside. In another scan configuration, the control scan cells reside on the same serial path (path2) on which the data scan cells reside.

Multiplexers 636-640 are provided for selecting the serial paths (path1) to be connected serially together between TDI and TDO, or for selecting the serial paths (path2) to be connected serially together between TDI and TDO. Control for the multiplexers to select a configuration of either path1 or path 2 between TDI and TDO comes from a SEL signal, which is connected to the select input of each multiplexer 636-640.

If the master and slave circuits and their associated boundary scan paths are realized as embedded cores within an IC, the SEL signal 634 may come from an IEEE 1149.1 instruction register on the IC, another register or circuit on the IC, or from an input pin on the IC. However, if the master and slave circuits and their associated boundary scan paths are realized as separate ICs on a board or MCM, the SEL signal may come from an IEEE 1149.1 instruction register on each of the ICs, another register or circuit on each of the ICs, or from an input pin on each of the ICs. In the case, where the master and slaves are separate ICs and where the SEL signal comes from an IEEE 1149.1 instruction register, or another register or circuit, on each IC, the SEL signal will not be bussed to the same wire 634 as shown in FIG. 6, but rather individual SEL signal wires will exist between the IEEE 1149.1 instruction register, or another register or circuit, and multiplexers 636-64 on each of the individual ICs.

During a functional mode of operation of the circuit in FIG. 6 data is transferred from one of the slaves to the master via the 32-bit data bus (D0-31) on connections 626. The master enables data transfer from slave 1 or slave 2 via the ENA1 and ENA2 control signals, respectively. Since the data scan cells of the scan paths are shared and used functionally, they cannot be scanned from TDI to TDO without disturbing the functional mode of the circuits. However, since the control scan cells of the scan paths are not shared, they can be scanned from TDI to TDO without disturbing the functional mode of the circuit.

By scanning the control scan cells by themselves, via path 1, it is possible to pre-load, while the master and slave circuits are functioning, a control test pattern into the control scan cells. This control test pattern can be advantageously used to establish the test mode state of the slave data busses to insure that no contention between the data busses occurs upon switching from functional mode to test mode. For example, a control test pattern may be scanned into the control scan cells via path 1 to, upon entry into test mode, enable slave 1's data bus and disable slave 2's data bus or to disable slave 1's data bus and enable slave 2's data bus. By designing the control scan cells as dedicated scan cells, and by selectively grouping only the control scan cells onto path1 between TDI and TDO, it is possible to pre-load a control test pattern to safely transition into test mode without slave bus contention and without disabling both slave buses.

Figure 1:
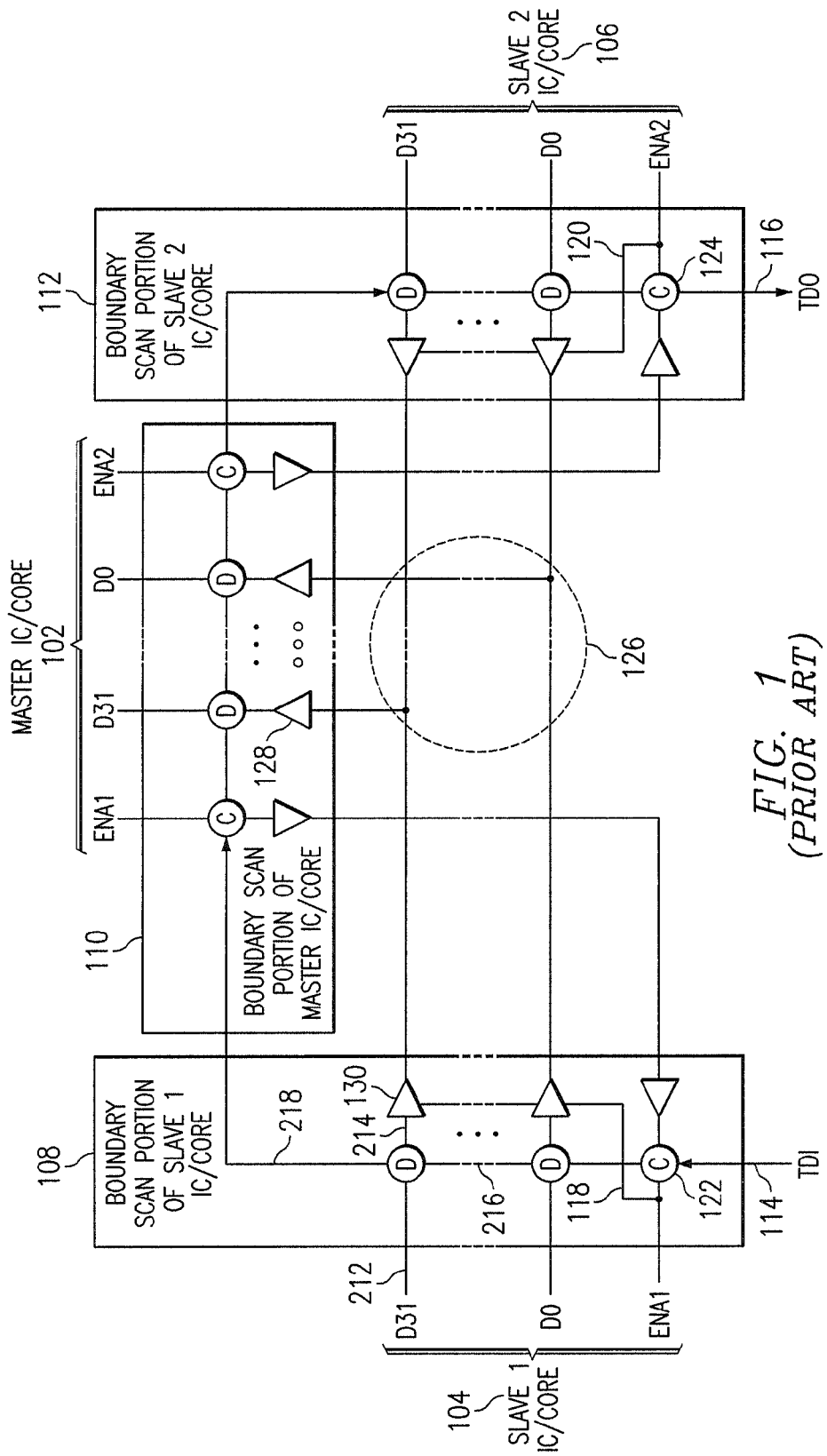
FIG. 1 is a simplified block diagram of a known boundary scan path around a master IC/core and two slave IC/cores.
Figure 2:
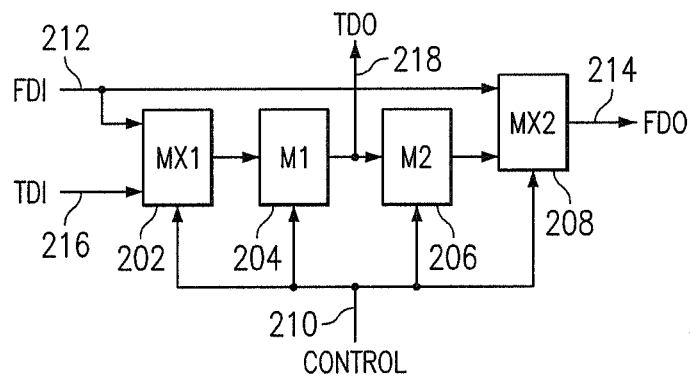
FIG. 2 is a schematic diagram of a known dedicated scan cell.

When a test mode is entered, functional operation of the circuits stop and the scan cells take control of the master and slave circuit's data and control signal paths. The state of the data scan cells will be unknown at the beginning of the test since they could not be scanned during functional mode. That is not a problem however since the known values scanned into the control scan cells prevent any contention on the data busses. After the test mode is entered, the multiplexers 636-640 are controlled to group both the control and data scan cells onto path 2. A first combined data and control scan cell test pattern is then shifted into the scan path via path2 and updated to start the test. The outputs of the control scan cells of FIG. 6 do not ripple during shift operations since they use the scan cell design of FIG. 2, thus bus contention between slaves is prevented during shift operations.

Figure 4:
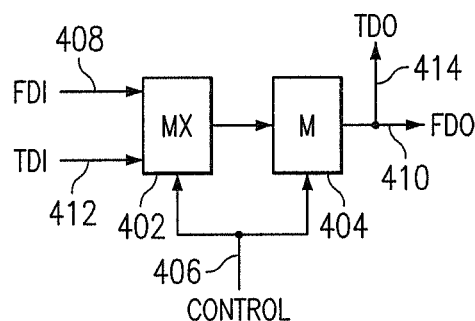
FIG. 4 is a schematic diagram of a known shared scan cell.

The outputs of the data scan cells do ripple during shift operation since they use the scan cell design of FIG. 4. However, this data ripple does not harm the circuit or cause bus contention since only one slave is enabled at a time to output data onto bus 626. While only two slave circuits 604 and 606, each with an associated boundary scan portions 608 and 612, were shown in FIG. 6, any number of slave circuits and associated boundary scan portions could be similarly connected to the master circuit 602 and associated boundary scan portion 610.

Figure 7:
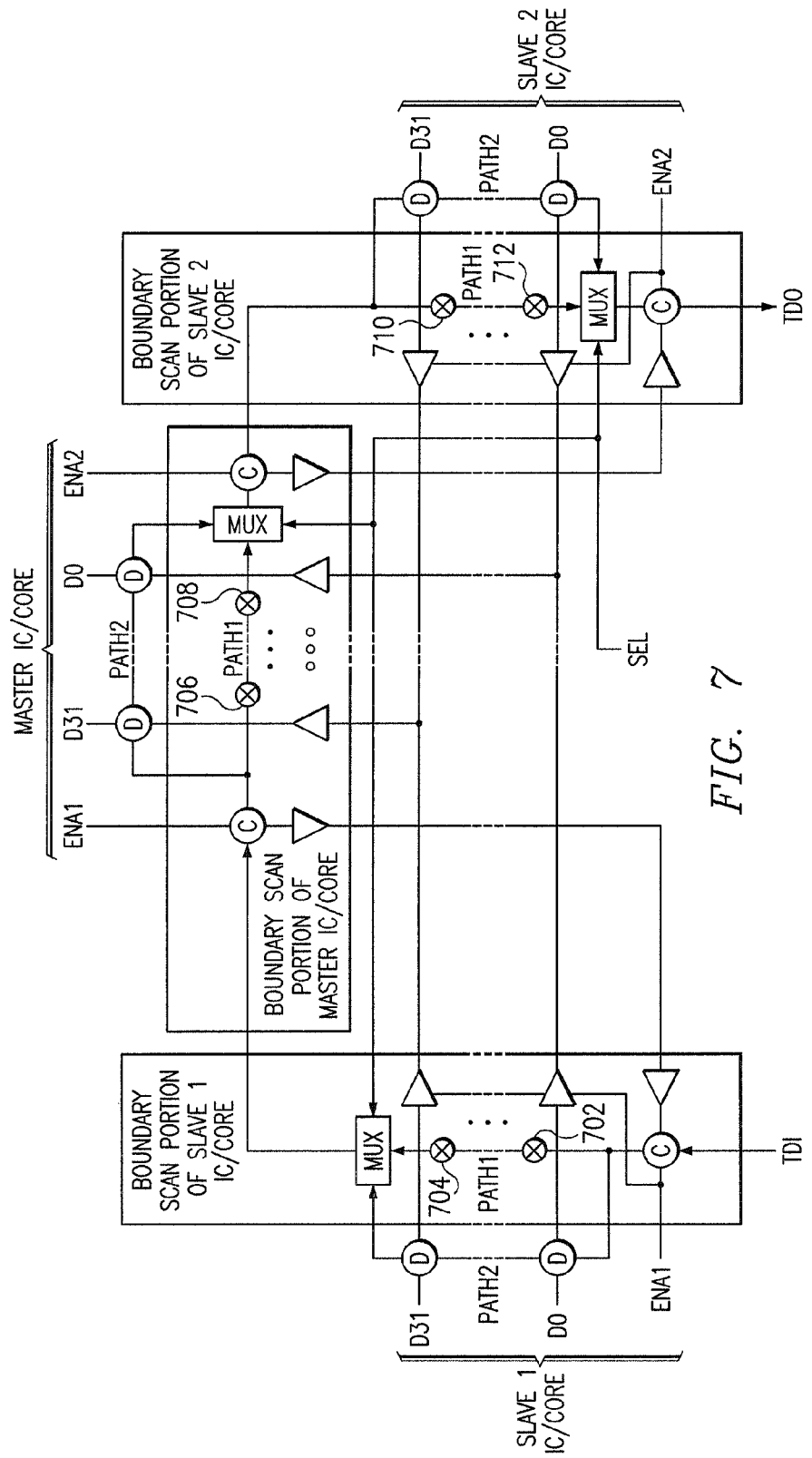
FIG. 7 illustrates the boundary scan system of FIG. 6 modified to include additional memories in the scan path.

In FIG. 7, the boundary scan system of FIG. 6 includes additional memories 702-712 in the serial paths path1. Depending upon the layout of the IC or core master and slave circuits, the wire running between the scan inputs and outputs of the control scan cells in path 1 may become long when bypassing a large number of shared data scan cells. If the wiring becomes to long the setup and hold times of the control scan cells may be violated, resulting in shift operation failures through path 1.

Figure 8:
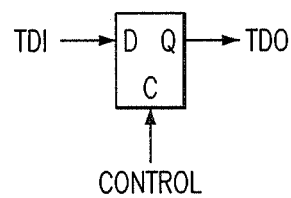
FIG. 8 is a schematic diagram of re-synchronization memories.
Figure 3:
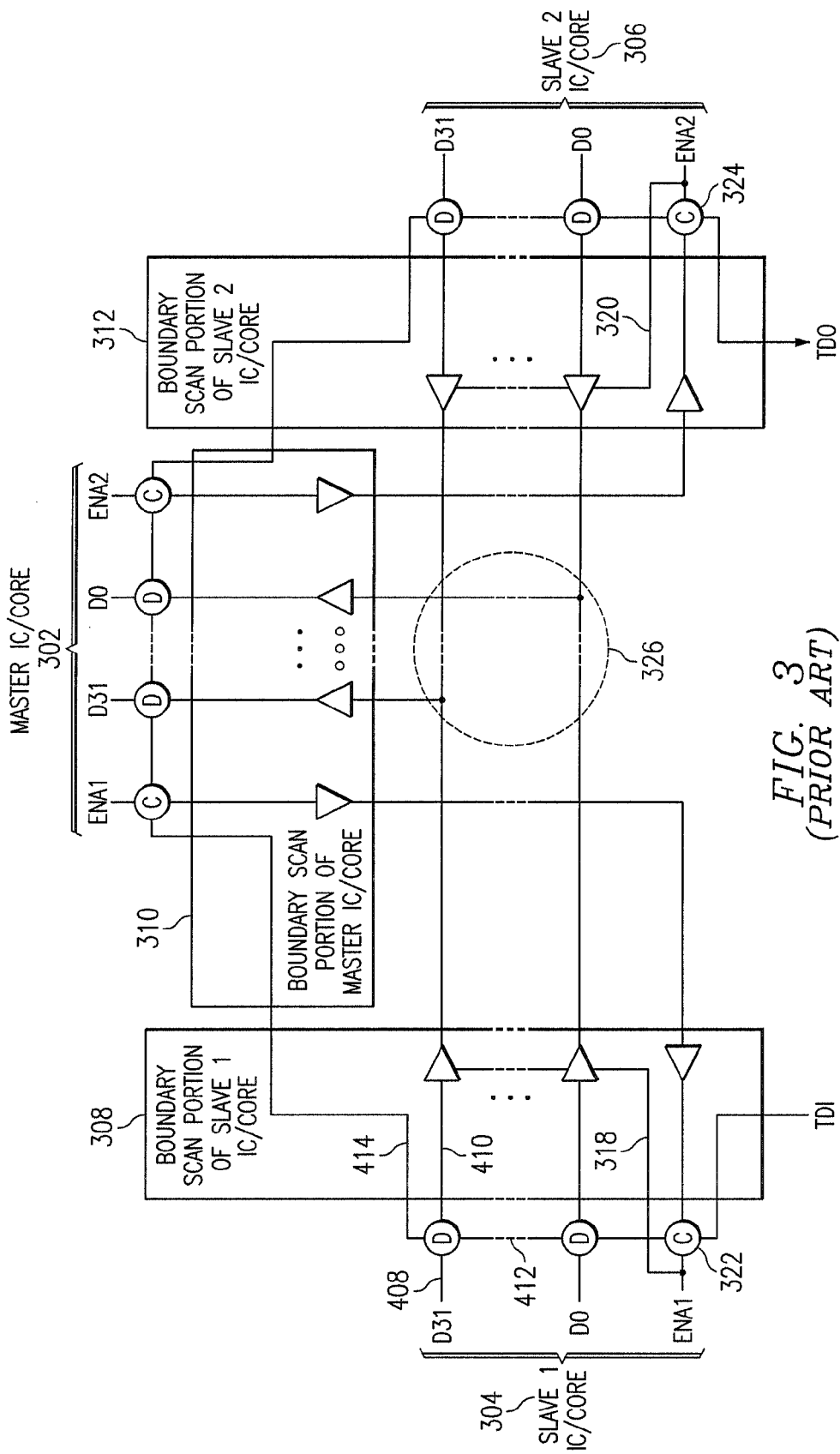
FIG. 3 is a simplified block diagram of a known shared boundary scan path around a master IC/core and two slave IC/cores.
Figure 5:
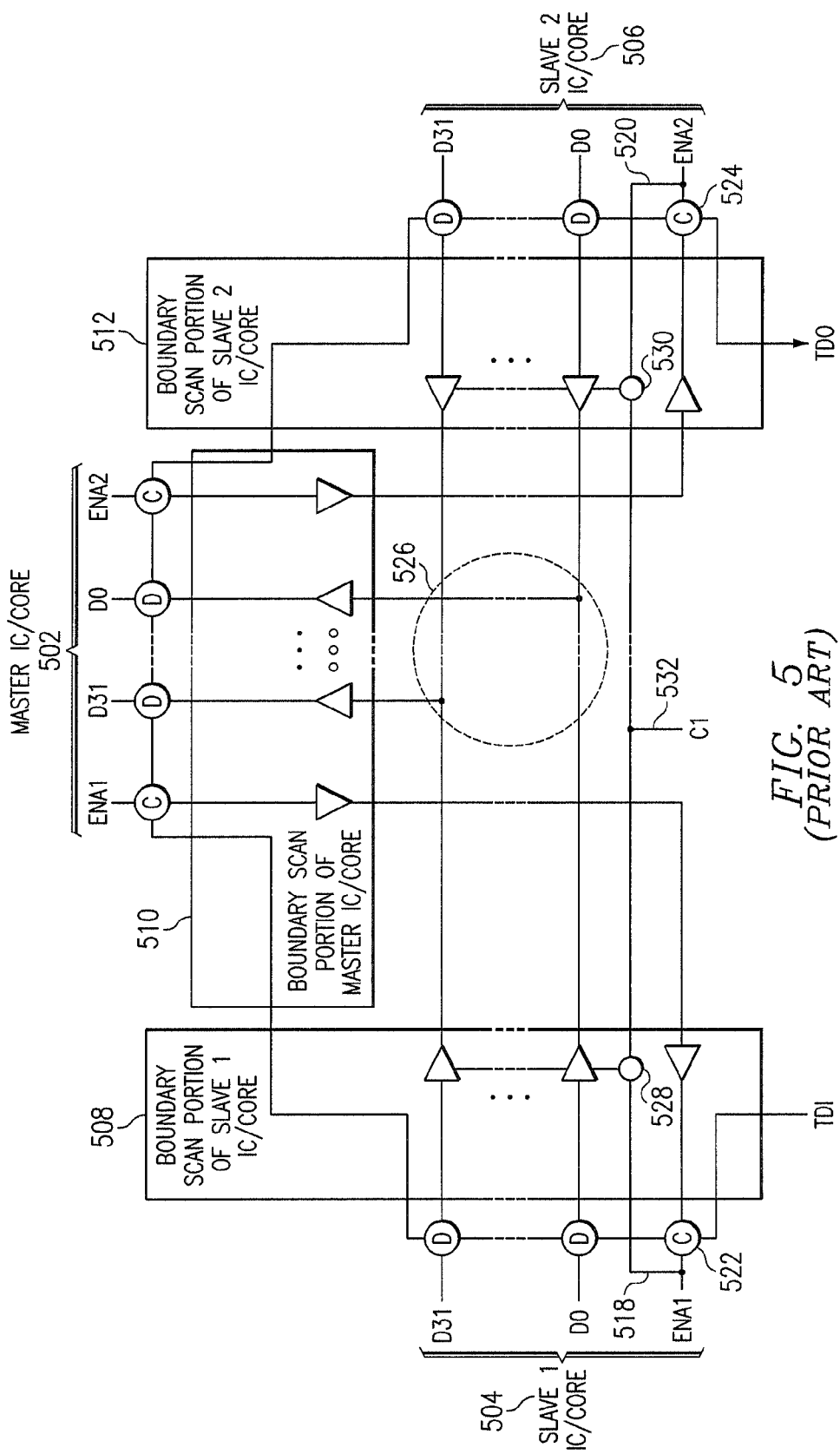
FIG. 5 is a simplified block diagram of a known boundary scan path around a master IC/core and two slave IC/cores with additional circuits to avoid voltage contention situations.

To prevent shift operation failures, one or more resynchronization memories 702-712 may be located in path1 between the scan outputs and scan inputs of the control scan cells. The resynchronization memories, typically D flip flops as shown in FIG. 8, would be located in scan path1 such that the control data shifted through path1 passes through a shorter length of wiring between the control scan cells and resynchronization memories, thus managing the setup and hold timing for reliably shifting data through path 1.

If resynchronization memories are used, the bit length of path 1 will grow by the number of resynchronization memories. To compensate for this bit length growth, each test pattern shifted into path will need to be augmented to include appropriately positioned resynchronization data bits during shift operations. In FIG. 7, the resynchronization memories 702-712 are not necessary when shift operations occur through path2, since the shared data scan cells are not being bypassed. Thus scan path2 does not include the resynchronization memories, and the test patterns shifted into scan path2 advantageously do not need to be augmented to include the aforementioned resynchronization data bits.

Figure 9:
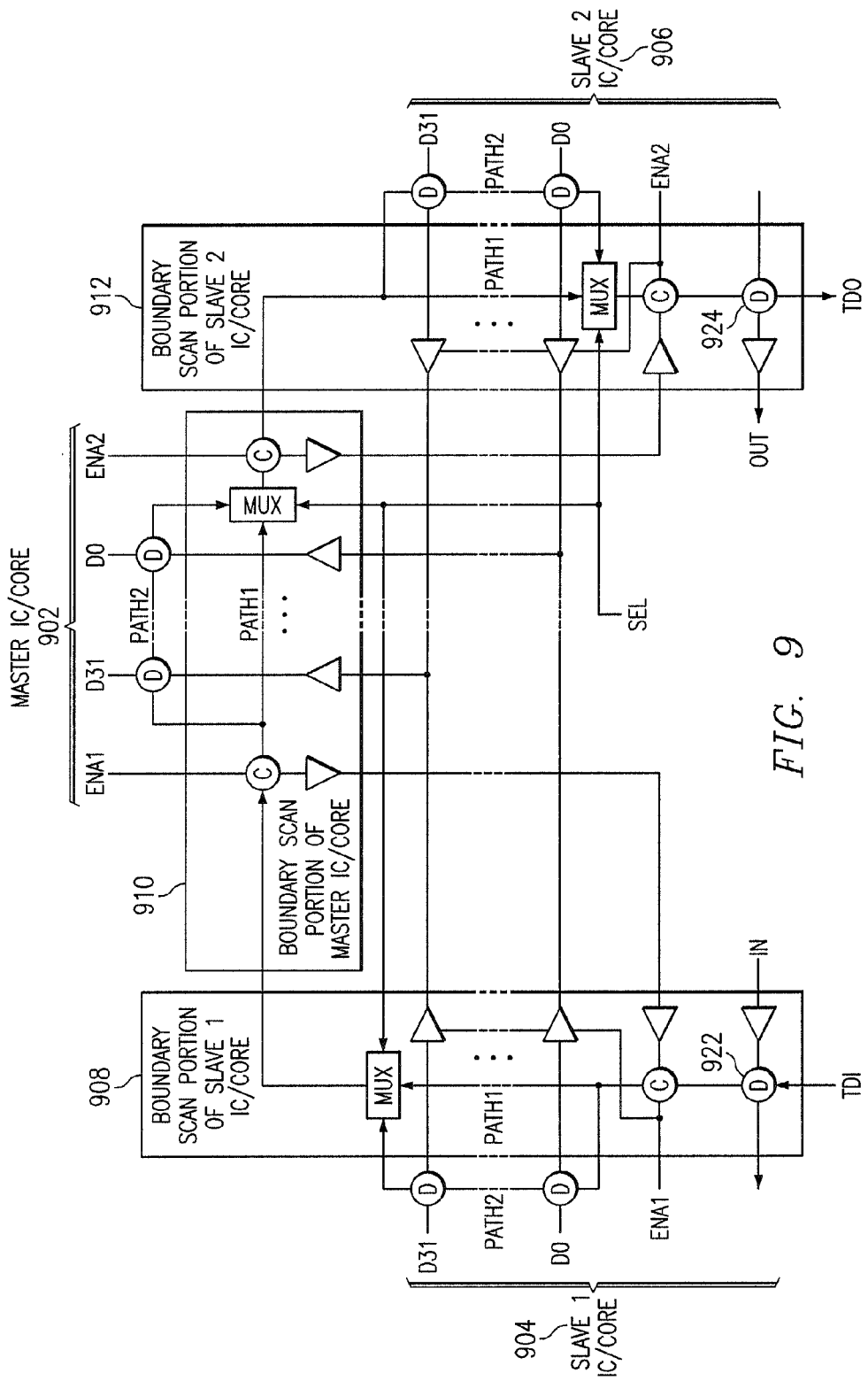
FIG. 9 is a simplified block diagram of a modified boundary scan path.

In FIG. 9, a boundary scan system consists of master circuit 902 and slave circuits 904 and 906. Boundary scan portion 908 of slave 904 is similar to boundary scan portion 608 of FIG. 6 with the exception that it includes an additional input (IN) to slave circuit 904 and an associated dedicated data scan cell 922. Also, boundary scan portion 912 of slave 906 is similar to boundary scan portion 612 of FIG. 6 with the exception that it includes an additional output (OUT) from slave circuit 906 and an associated dedicated data scan cell 924.

The arrangement of FIG. 9 indicates that dedicated data scan cells 922 and 924 (i.e. a scan cell similar to that of FIG. 2) can be included in both path1 and path2 shift operations. When the path1 serial paths are selected between TDI and TDO, data can be shifted through the control scan cells (C) and the 922 and 924 data scan cells (D) of FIG. 9 during functional mode. When the path2 serial paths are selected between TDI and TDO, data can be shifted through all the scan cells of FIG. 9, both shared and dedicated, during test mode.

While specific signal types, i.e. data and control, have been associated with shared and dedicated scan cells in FIGS. 6 and 9, it should be understood that in general shared and dedicated scan cells are independent of signal types. What is important is to associate dedicated scan cells with signal types that need to be preconditioned with data prior to entry into test mode. Shared scan cells, on the other hand, can be associated with signal types that do not need to be preconditioned with data prior to test mode entry.

The arrangements of FIGS. 6 and 9 and their accompanying descriptions have described a boundary scan path system consisting of groups of dedicated scan cells and groups of shared scan cells. Multiplexers within the boundary scan path system allow partitioning the boundary scan path to allow serial access to occur either to only the dedicated scan cell groups or to both the dedicated and shared scan cells groups. The ability to serially access dedicated scan cells within a boundary scan system independent of the shared scan cells, and while the functional circuits operate, advantageously allows loading certain key data signals which facilitate safe entry into test mode from the functional mode.

The arrangements of FIGS. 6 and 9 and their accompanying descriptions have also described a process for safely transitioning circuits and their associated boundary scans paths from their functional mode to test mode. The process can be summarized as: (1) configuring the boundary scan path system to contain only dedicated scan cells between TDI and TDO, (2) performing a shift operation to load data into the dedicated scan cells, (3) entering the boundary scan test mode, (4) configuring the boundary scan path system to contain all scan cells, both shared and dedicated, between TDI and TDO, and (5) performing a shift operation to load data into all the scan cells.

The arrangement of FIG. 7 and its accompanying description has described why resynchronization memories may be needed and how they may be used to register data transfers across bypassed sections of shared scan cells to resolve setup and hold timing problems that might exist between a sending and receiving dedicated scan cell.

Although the present disclosure has been described in accordance to the embodiments shown in the figures, one of ordinary skill in the art will recognize there could be variations to these embodiments and those variations should be within the spirit and scope of the present disclosure. Accordingly, modifications may be made by one ordinarily skilled in the art without departing from the spirit and scope of the appended claims.

What is claimed is:

1. An integrated circuit comprising:
A. a first circuit having data input leads connected to the inputs of input data buffers, control output leads connected to the outputs of control output buffers, and a first scan path coupled between a test data input lead and a test data output lead, the first scan path including:
 i. a first control scan cell having a functional data input, a functional data output connected to an input of a first control output buffer, a test data input coupled to the test data input lead, and a test data output separate from the functional data output;
 ii. first data scan cells, each first data scan cell having a functional data input connected to a data output of one data input buffer, a test data input, and a combined functional and test data output, the first data scan cells being connected in a series, the test data input of the initial first data scan cell in the series being connected to the test data output of the first control scan cell, and the test data input of each successive first data scan cell in the series being connected to the combined functional and test data output of the previous first data scan cell;
 iii. multiplexer circuitry having one input connected to the test data output of the last first data scan cell in the series, another input connected to the test data output of the first control scan cell, and an output; and
 iv. a second control scan cell having a functional data input, a functional data output connected to the input of a second control output buffer, a test data input coupled to the output of the multiplexer, and a test data output separate from the functional data output coupled to the test data output lead;
B. a second circuit having data output leads coupled to respective data input leads of the first circuit and having a control input lead coupled to a control output lead of the first circuit, the data output leads being connected to the outputs of tri-state data output buffers, each tri-state data output buffer having a tri-state control input for, when active, placing the output of the tri-state data output buffer in a high impedance output state, the control input lead being connected to the input of a control input buffer, and a second scan path coupled between the test data input lead and the test data output lead, the second scan path including:
 i. second data scan cells, each second data scan cell having a functional data input, a test data input, and a combined functional and test data output, the second data scan cells being connected in series, the test data input of the initial second data scan cell in the series being coupled to the test data input lead, and the test data input of each successive second data scan cell being connected to the combined functional and test data output of the previous second data scan cell, the combined functional and test data output of each second data scan cell also being connected to the data input of one tri-state data output buffer;

ii. multiplexer circuitry having one input connected to the combined functional and test data output of the last second data scan cell in the series, another input coupled to the test data input lead, and an output; and iii. a third control scan cell having a functional data input connected to the output of the control input buffer, a functional data output connected to the tri-state control inputs of all the data output tri-state buffers, a test data input connected to the output of the multiplexer, and a test data output that is separate from the functional data output and that is coupled to the test data output lead; and C. leads coupling the first and second scan paths between the test data input lead and the test data output lead.

2. The integrated circuit of claim 1 in which the first control scan cell includes:

i. an input multiplexer having a first input connected to the functional data input, a second input connected to the test data input, and an output, ii. a first memory having an input connected to the output of the input multiplexer and an output connected to the test data output, iii. a second memory having an input connected to the output of the first memory and an output; and iv. an output multiplexer having an input connected to the first input of the input multiplexer, a second input connected to the output of the second memory, and an output connected to the input of the first control output buffer.

3. The integrated circuit of claim 1 in which each second data scan cell includes:

i. an input multiplexer having an input connected to an output of an input data buffer, another input connected to the test data input, and an output, and ii. a memory having an input connected to the output of the input multiplexer and an output connected to the combined functional and test data output.

4. The integrated circuit of claim 1 in which the first circuit is a master circuit and the second circuit is a slave circuit.

\* \* \* \* \*